United States Patent
Berg et al.

(10) Patent No.: US 8,441,302 B2
(45) Date of Patent: May 14, 2013

(54) CIRCUIT COMPRISING AT LEAST A FIRST TRANSISTOR GROUP AND A SECOND TRANSISTOR GROUP

(75) Inventors: Håkan Berg, Harestad (SE); Heiko Thiesies, Torslanda (SE)

(73) Assignee: SAAB AB, Linköping (SE)

( * ) Notice: Subject to any disclaimer, the term of this patent is extended or adjusted under 35 U.S.C. 154(b) by 205 days.

(21) Appl. No.: 13/125,929

(22) PCT Filed: Oct. 24, 2008

(86) PCT No.: PCT/SE2008/051207
§ 371 (c)(1),
(2), (4) Date: Apr. 25, 2011

(87) PCT Pub. No.: WO2010/047631
PCT Pub. Date: Apr. 29, 2010

(65) Prior Publication Data
US 2011/0210785 A1    Sep. 1, 2011

(51) Int. Cl.
*G06F 7/44* (2006.01)
(52) U.S. Cl.
USPC .......................................... 327/359; 327/563
(58) Field of Classification Search .................. 327/359, 327/563
See application file for complete search history.

(56) References Cited

U.S. PATENT DOCUMENTS

| 4,156,283 | A | 5/1979 | Gilbert |
| 6,563,365 | B2* | 5/2003 | Knierim et al. ............... 327/355 |
| 7,501,887 | B2 | 3/2009 | Stephelbauer et al. |
| 7,589,579 | B2* | 9/2009 | Sanduleanu et al. .......... 327/359 |
| 2006/0097787 | A1 | 5/2006 | Ryynanen et al. |
| 2006/0202751 | A1 | 9/2006 | Stephelbauer et al. |

FOREIGN PATENT DOCUMENTS

| EP | 1 515 431 A1 | 3/2005 |
| WO | WO-95/32548 A1 | 11/1995 |

OTHER PUBLICATIONS

Extended Search Report from the European Patent Office, issued on Mar. 26, 2012 in connection with corresponding European Application No. EP 08 87 7594.
PCT/ISA/210—International Search Report—Jun. 25, 2009.
PCT/ISA/237—Written Opinion of the International Searching Authority—Jun. 25, 2009.
PCT/IPEA/409—International Preliminary Report on Patentability—Feb. 1, 2011.

* cited by examiner

*Primary Examiner* — Hai L Nguyen
(74) *Attorney, Agent, or Firm* — Venable LLP; Eric J. Franklin (57) ABSTRACT

A circuit including a first transistor group and a second transistor group. The transistor groups are connected such that they are arranged to be fed with at least one input signal, and such that they are arranged to output at least two currents. At least two transistors are arranged to be biased in such a way that desired signal paths are obtained in the circuit, such that a desired output current ratio is obtained.

6 Claims, 5 Drawing Sheets

CIRCUIT COMPRISING AT LEAST A FIRST TRANSISTOR GROUP AND A SECOND TRANSISTOR GROUP

CROSS-REFERENCE TO RELATED APPLICATIONS

This application is the national phase under 35 U.S.C. §371 of PCT/SE2008/051207 filed 24 Oct. 2008.

TECHNICAL FIELD

The present invention relates to a circuit comprising at least a first transistor group and a second transistor group, where the transistor groups are connected such that they are arranged to be fed with at least one input signal, and such that they are arranged to output at least two currents.

BACKGROUND

In the field of microwave electronics, a so-called Gilbert cell is often used as a mixer. The Gilbert cell was invented by Barrie Gilbert, and its basics are for example described in U.S. Pat. No. 4,156,283. It is also possible to use a Gilbert cell as an attenuator with a possibility to attenuate an RF signal all the way to zero, by applying a DC voltage on the LO input of the mixer.

Figure 1:
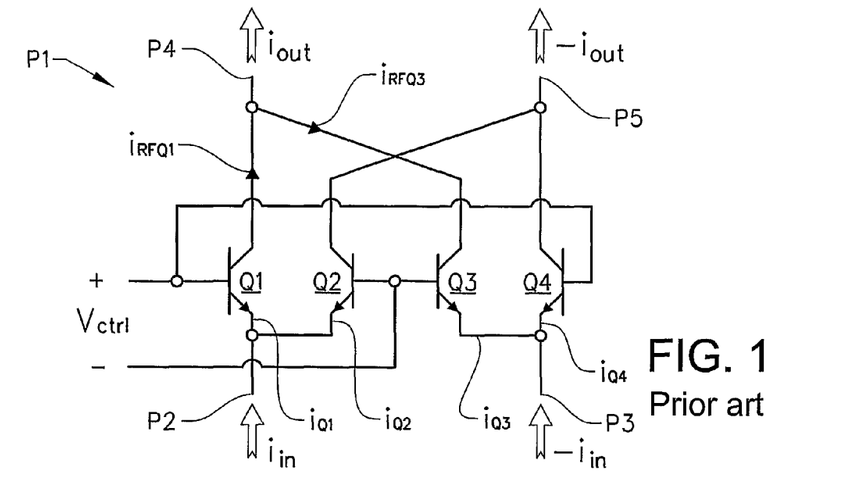
FIG. 1 shows the schematics for a prior art Gilbert cell.

A Gilbert cell P1 according to prior art will now be described with reference to FIG. 1. There is a first transistor Q1, a second transistor Q2, a third transistor Q3 and a fourth transistor Q4. There is a first input P2 for an input RF current $i_{in}$, and a second input P3 for an RF current $-i_{in}$. There is also a first output P4 for an output RF current $i_{out}$, and a second output P5 for an RF current $-i_{out}$.

A bias voltage source $V_{ctrl}$ provides a positive bias voltage which is applied to the bases of the first transistor Q1 and the fourth transistor Q4, and a negative bias voltage which is applied to the bases of the second transistor Q2 and the third transistor Q3, the bias voltages giving rise to bias currents. There is a corresponding DC bias current $i_{Q1}, i_{Q2}, i_{Q3}, i_{Q4}$, for each one of the transistors Q1, Q2, Q3, Q4, where each DC bias current $i_{Q1}, i_{Q2}, i_{Q3}, i_{Q4}$ affects the RF current through its corresponding transistor Q1, Q2, Q3, Q4. The resistance into the emitter of a transistor is inversely proportional to the magnitude of the bias current, and using the fundamental current laws, the RF current $i_{RFQ1}$ passing through Q1 can be written as.

$$i_{RFQ1} = i_{in} \cdot \frac{i_{Q1}}{i_{Q1} + i_{Q3}}. \quad (1)$$

There is a first branch from the first output P4 to the third transistor Q3 and a second branch from the second output P5 to the second transistor Q2. The RF current in the first branch, i.e. the RF current $i_{RFQ3}$ passing through the third transistor Q3 can be written as.

$$i_{RFQ3} = i_{in} \cdot \frac{i_{Q3}}{i_{Q1} + i_{Q3}}. \quad (2)$$

A Gilbert cell works by controlling the route for the input RF current through the transistors. The first output RF current $i_{out}$ at the first output P4 may be written as $i_{out} = i_{RFQ1} - i_{RFQ3}$, which is summarized in the equation below:

$$i_{out} = i_{in} \cdot \frac{i_{Q1}}{i_{Q1} + i_{Q3}} - i_{in} \cdot \frac{i_{Q3}}{i_{Q1} + i_{Q3}} = i_{in} \cdot \frac{i_{Q1} - i_{Q3}}{i_{Q1} + i_{Q3}}. \quad (3)$$

In the same way, a corresponding expression may be obtained for the second output RF current $-i_{out}$ at the second output P5.

As evident from the expression (3), there is a problem with this type of attenuator; the higher attenuation that is desired, the smaller the difference between the bias currents has to be. For example, 20 dB attenuation means that 45% of the bias current shall pass through Q3 and 55% of the bias current shall pass through Q1. Furthermore, 40 dB attenuation means that 49.5% of the bias current shall pass through Q3 and 50.5% of the bias current shall pass through Q1. In order to obtain these very small current differences, a very accurate control of the bias voltage is required due to the transistors' high transconductance when biased, i.e. a small variation of the base emitter voltage, less than a millivolt, causes the difference in the bias currents to be to large. At the same time, the circuit is extremely sensitive to resistive feedback at the emitters, since this affects the bias difference between the two transistors involved.

There is thus a need for a design of a similar attenuator which does not require such an accurate control of the bias currents.

SUMMARY

The object of the present invention is to disclose a Gilbert cell type attenuator which does not require an accurate control of the bias currents for large attenuations.

This object is solved by means of an arrangement according to the introduction. Furthermore, at least two transistors are arranged to be biased in such a way that desired signal paths are obtained in the circuit, such that a desired output current ratio is obtained.

A number of advantages are obtained by means of the present invention, for example the very accurate control voltage previously needed is not necessary any more in order to obtain a corresponding effect.

BRIEF DESCRIPTION OF THE DRAWINGS

The invention will now be described more in detail, with reference to the appended drawings, where.

DETAILED DESCRIPTION

Figure 2:
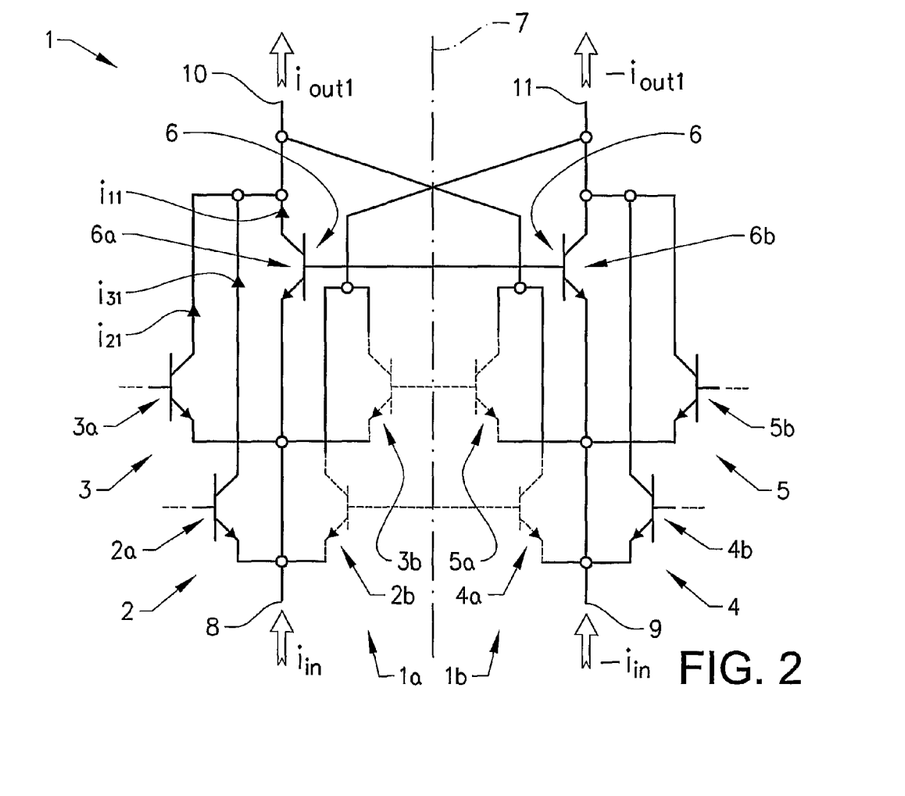
FIG. 2 shows the schematics for the present invention in a first mode.

In FIG. 2, showing an amplifier circuit 1, there is a first transistor pair 2, a second transistor pair 3, a third transistor pair 4 and a fourth transistor pair 5, each transistor pair 2, 3, 4, 5 comprising a first transistor 2a, 3a, 4a, 5a and a second transistor 2b, 3b, 4b, 5b. The amplification may be negative, such that the amplifier circuit 1 works as an attenuator circuit. The first transistor pair 2 and the third transistor pair 4 are mirrored such that the bases of the first transistor pair's second transistor 2b and the third transistor pair's first transistor 4a are connected. The bases of the first transistor pair's first transistor 2a and the third transistor pair's second transistor 4b are connected as well. For reasons of clarity in FIG. 2, and also in FIGS. 3 and 4, this connection is not shown, the leads from the bases are indicated with dotted lines. In the same way, the corresponding bases of the second transistor pair's second transistor 3b and the fourth transistor pair's first transistor 5a are connected. Also, the bases of the second transistor pair's first transistor 3a and the fourth transistor pair's second transistor 5b are connected. For reasons of clarity in FIG. 2, and also in FIGS. 3 and 4, this connection is not shown, the leads from the bases are indicated with dotted lines.

There is also a fifth transistor pair 6, comprising a first transistor 6a and a second transistor 6b, where said first transistor 6a and second transistor 6b are mirrored such that the bases of the first transistor 6a and the second transistor 6b are connected. All mirroring is made in a symmetry line 7 dividing the circuit 1 in two equal halves 1a, 1b.

There is a first input 8 for an input RF current $i_{in}$, and a second input 9 for an RF current $-i_{in}$. There is also a first output 10 for an output RF current $i_{out}$, and a second output 11 for an RF current $-i_{out}$.

The first input RF current $i_{in}$ is branched such that it may pass through to the collectors of the transistors 2a, 2b; 3a, 3b in the first transistor pair 2 and the second transistor pair 3, and the first transistor 6a in the fifth transistor pair 6.

The second input RF current $-i_{in}$ is branched such that it may pass the collectors of the transistors 4a, 4b; 5a, 5b in the third transistor pair and the fourth transistor pair, and the second transistor 6b in the fifth transistor pair 6.

The collectors of the first transistors 2a, 3a, 4a, 5a, 6a in the first transistor pair 2, the second transistor pair 3, the third transistor pair 4, the fourth transistor pair 5 and the fifth transistor pair 6 are connected to each other and to the first output 10. All other transistor's 2b, 3b, 4b, 5b, 6b collectors are connected to the second output 11.

According to the present invention, either one of the transistors 2a, 2b; 3a, 3b; 4a, 4b; 5a, 5b of the first transistor pair 2, the second transistor pair 3, the third transistor pair 4, and the fourth transistor pair 5 is switched on, and the other one is switched off, symmetrically with respect to the symmetry line 7, such that the RF current is controlled to pass a fixed route through the circuit 1. The individual input resistance of a transistor is only changed between a high and a fixed value by means of the DC bias current. The fixed value is chosen appropriately by means of the electrical properties of the certain transistor size and also type chosen.

The mirrored first and third pairs 2, 4 comprise transistors 2a, 2b; 4a, 4b that preferably are chosen such that they present an essentially equal resistance for the RF current. The same applies for the mirrored second and fourth pairs 3, 5.

By means of the present invention, the RF current is directed to take a certain route in the circuit, from a choice of routes, where each route presents a certain fixed attenuation. The DC bias currents (no shown in the Figure) which are applied to the transistors 2a, 2b; 3a, 3b; 4a, 4b; 5a, 5b are now only used to turn transistors on and off, not to adjust their RF current resistances. In order to turn on and off transistors, no accurate voltage difference is required; a voltage difference on the bases of about 0.4±0.15 V is sufficient if bipolar transistors are considered. The transistors 2a, 2b; 3a, 3b; 4a, 4b; 5a, 5b are thus biased in such a way that desired signal paths are obtained in the circuit, such that a desired output current ratio is obtained.

In the following, four examples will be presented for different RF current routes of the present circuit. In all examples, the transistors 2a, 2b; 4a, 4b in the first pair 2 and third pair 4 present a RF current resistance of $$\frac{60}{7}\Omega,$$

the transistors 3a, 3b; 5a, 5b in the second pair 3 and fourth pair 5 present a RF current resistance of $$\frac{60}{20}\Omega = 3\Omega,$$

and the transistors 6a, 6b in the fifth pair 6 present a RF current resistance of $$\frac{60}{33}\Omega.$$

As stated above, each resistance value is dependent on the electrical properties of the certain transistor type and size chosen.

FIG. 2 shows a first mode of amplification. Denoted with dotted lines, the second transistors 2b, 3b in the first pair 2 and the second pair 3 are turned off. Furthermore, the first transistors 4a, 5a in the third pair 4 and the fourth pair 5 are also turned off. In this configuration there is no current attenuation; the following is acquired for a first output current $i_{out1}$:

$$i_{out1} = i_{11} + i_{21} + i_{31} = \frac{33}{60}i_{in} + \frac{20}{60}i_{in} + \frac{7}{60}i_{in} = i_{in}$$

This certain configuration thus provides maximum amplification.

Figure 3:
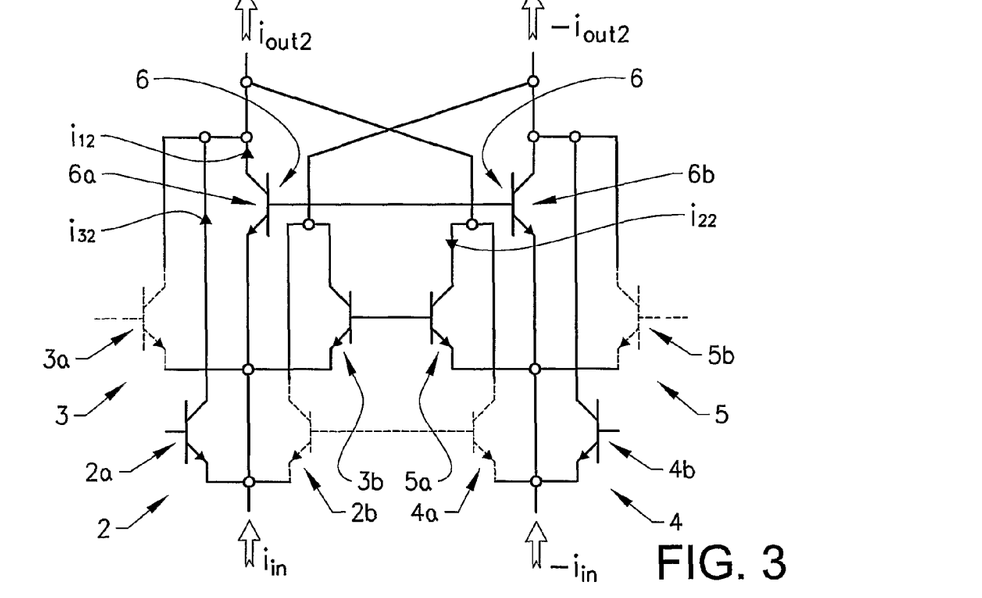
FIG. 3 shows the schematics for the present invention in a second mode.

FIG. 3 shows a second mode of amplification. Denoted with dotted lines, the second transistors 2b, 5b in the first pair 2 and the fourth pair 5 are turned off. Furthermore, the first transistors 3a, 4a in the second pair 3 and the third pair 4 are also turned off. In this configuration, there is a certain first relative attenuation; the following is acquired for a second output current $i_{out2}$:

$$i_{out2} = i_{12} - i_{22} + i_{32} = \frac{33}{60}i_{in} - \frac{20}{60}i_{in} + \frac{7}{60}i_{in} = \frac{20}{60}i_{in} = \frac{1}{3}i_{in}.$$

The first relative attenuation is thus approximately 10 dB.

Figure 4:
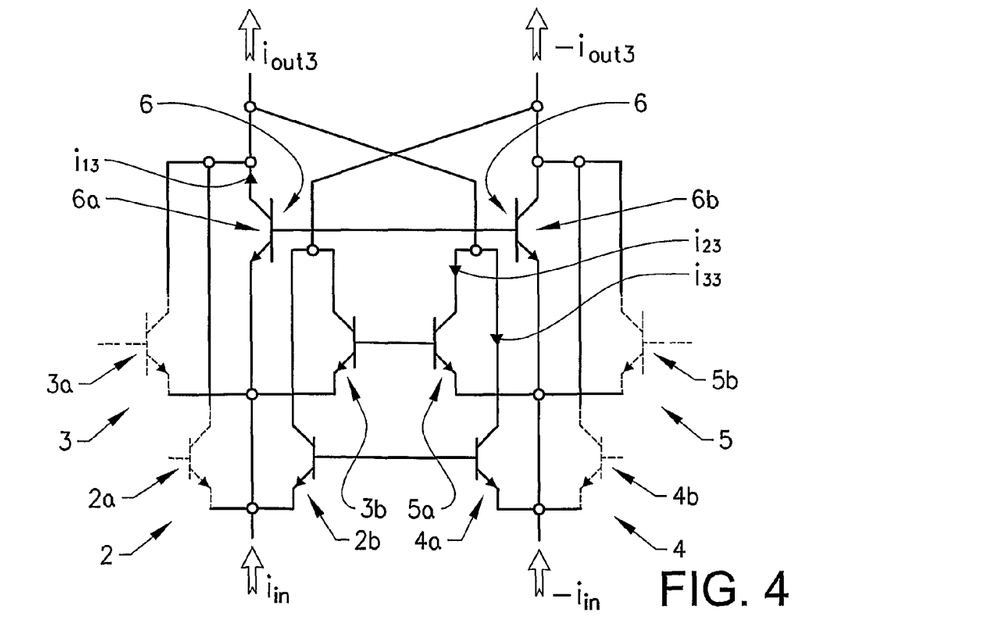
FIG. 4 shows the schematics for the present invention in a third mode.

FIG. 4 shows a third mode of amplification. Denoted with dotted lines, the first transistors 2a, 3a in the first pair 2 and the second pair 3 are turned off. Furthermore, the second transistors 4b, 5b in the third pair 4 and the fourth pair 5 are also turned off. In this configuration there is a certain second relative attenuation; the following is acquired for a third output current $i_{out3}$:

$$i_{out3} = i_{13} - i_{23} - i_{33} = \frac{33}{60}i_{in} - \frac{20}{60}i_{in} - \frac{7}{60}i_{in} = \frac{6}{60}i_{in} = \frac{1}{10}i_{in}.$$

The second relative attenuation is thus 20 dB.

Figure 5:
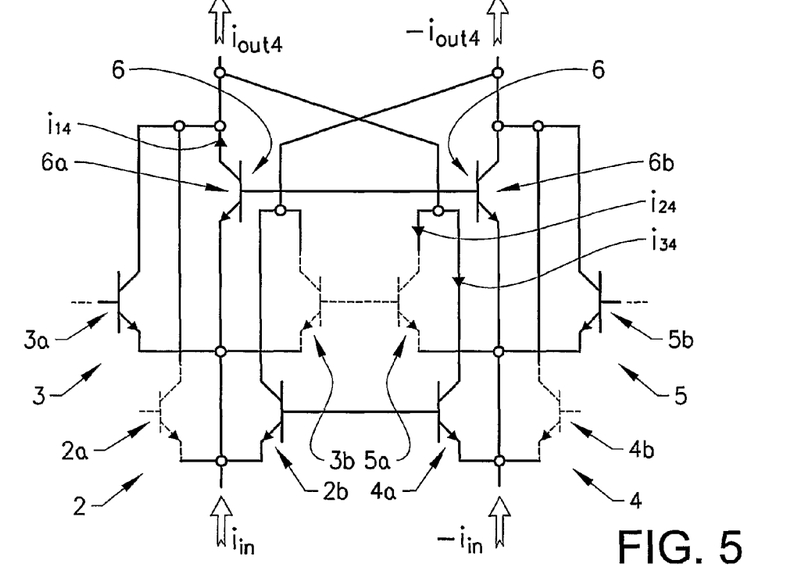
FIG. 5 shows the schematics for the present invention in a fourth mode.

Finally, FIG. 5 shows a fourth mode of amplification. Denoted with dotted lines, the first transistors 2a, 5a in the first pair 2 and the fourth pair 5 are turned off. Furthermore, the second transistors 3b, 4b in the second pair 3 and the third pair 4 are also turned off. In this configuration, there is a certain third relative attenuation; the following is acquired for a fourth output current $i_{out4}$:

$$i_{out4} = i_{14} + i_{24} - i_{34} = \frac{33}{60}i_{in} + \frac{20}{60}i_{in} - \frac{7}{60}i_{in} = \frac{23}{30}i_{in}$$

The third relative attenuation is thus approximately 2 dB.

It is apparent that many different levels of attenuation levels may be acquired for different circuit configurations. For more attenuation levels, more transistor pairs are added to the configuration according to the FIGS. 2-5.

Figure 6:
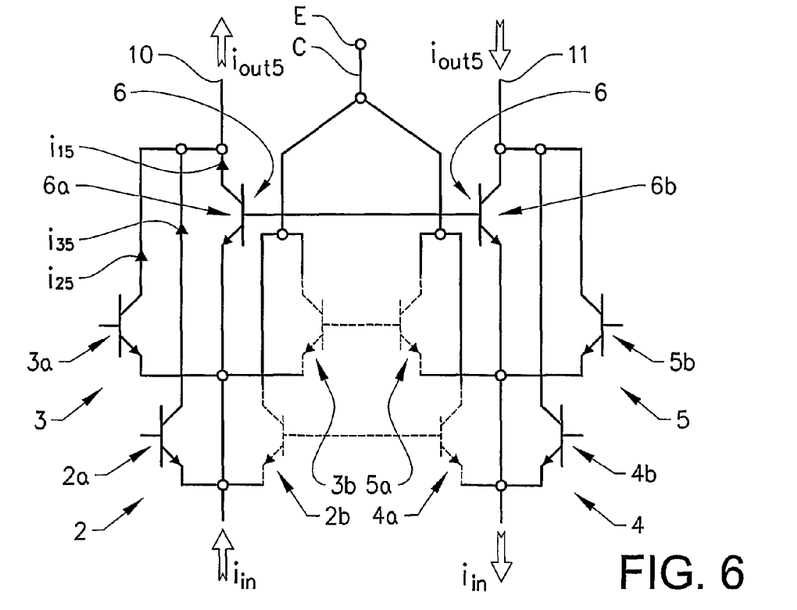
FIG. 6 shows the schematics for the present invention in an alternative form, having a common output line.

FIG. 6 shows an alternative embodiment example. Generally, the connections are similar to the ones shown in FIG. 2. The same reference signs are used for the transistors in the same positions.

The collectors of the first transistors 2a, 3a, 6a in the first transistor pair 2, the second transistor pair 3, and the fifth transistor pair 6 are connected to each other and to the first output 10. The collectors of the second transistors 4b, 5b, 6b the third transistor pair 4, the fourth transistor pair 5, and the fifth transistor pair 6 are connected to each other and to the second output 11.

Furthermore, in this embodiment, the collectors of the second transistors 2b, 3b, 4a, 5a of the first transistor pair 2, the second transistor pair 3 the third transistor pair 4, and the fourth transistor pair 5 are connected to a common output line C which is connected to a voltage source E of for example+ 5V. Alternatively, the common output line is connected to ground via a resistor (not shown).

In this alternative embodiment, the currents that run through the collectors of the second transistors 2b, 3b, 4a, 5a of the first transistor pair 2, the second transistor pair 3 the third transistor pair 4, and the fourth transistor pair 5 are combined in the common output line C, and not used furthermore. Only the currents that are combined to the first output 10 and the second output 11 constitute useful currents.

The circuit in FIG. 6 corresponds to the one shown in FIG. 2, where the second transistors 2b, 3b, 4a, 5a of the first transistor pair 2, the second transistor pair 3 the third transistor pair 4, and the fourth transistor pair 5 are turned off. Thus, the alternative connection used, where there is common output line C, does not make any difference in this case. In this configuration there is no current attenuation; the following is acquired for a fifth output current $i_{out5}$:

$$i_{out5} = i_{15} + i_{25} + i_{35} = \frac{33}{60}i_{in} + \frac{20}{60}i_{in} + \frac{7}{60}i_{in} = i_{in}.$$

The transistors may be turned off in the same manner as described with reference to FIGS. 4, 5 and 6, which results in corresponding output currents $i_{out6}$, $i_{out7}$ and $i_{out8}$:

$$i_{out6} = \frac{33}{60}i_{in} + 0 \cdot \frac{20}{60}i_{in} + \frac{7}{60}i_{in} = \frac{40}{60}i_{in}$$

$$i_{out7} = \frac{33}{60}i_{in} + 0 \cdot \frac{20}{60}i_{in} + 0 \cdot \frac{7}{60}i_{in} = \frac{33}{60}i_{in}$$

$$i_{out8} = \frac{33}{60}i_{in} + \frac{20}{60}i_{in} + 0 \cdot \frac{7}{60}i_{in} = \frac{53}{60}i_{in}$$

Figure 7:
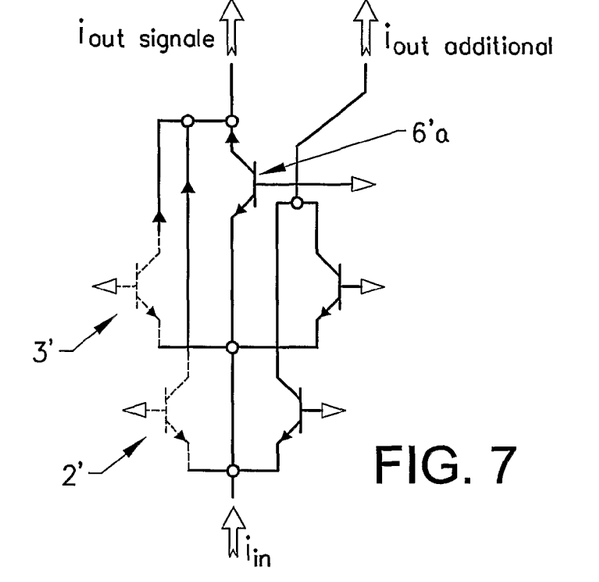
FIG. 7 shows the schematics for the present invention in a reduced version of the one shown in FIG. 6.

In FIG. 7, only one half of the circuit according to FIG. 6 is used, corresponding to the first half 1a shown in FIG. 2. This means that the circuit no longer is of differential nature. The circuit comprises a first transistor pair 2' and a second transistor pair 3' and a single transistor 6a'. The output current $i_{outsingle}$ is equal to $i_{out5}$, $i_{out6}$, $i_{out7}$ or $i_{out8}$. The triangular signs represent RF-shorted bias sources. There is also another output current $i_{additional}$, which is output from a line C' that corresponds to the common output line described with reference to FIG. 6. Its function corresponds to the one described with reference to FIG. 6.

In the following the present invention will be described more generally with reference to FIG. 8, which shows a very simple prior art version, and FIG. 9, which shows the present invention in its least complicated form.

The essence of the problem solved by the present invention is now described with reference to FIG. 8. Here, a first transistor 12 and a second transistor 13 have their bases connected to an input voltage $v_{in}$. The collectors of the transistors are connected to a control current source $1_{ctrl}$. The collectors of the transistors output a respective first output current $i'_{out1}$ and second output current $i'_{out2}$. Of course, the input voltage could be an input current, and the control current be a control voltage. The configurations of the voltage sources and current sources shown here and in the rest of the examples of the present invention are only examples.

The two output currents are controlled by the analogue DC control currents supplied by the control current source $1_{ctrl}$. In this case, the two output currents $i'_{out1}$ $i_{out2}$ are controlled in an analogue manner, with the problems described initially.

Figure 9:
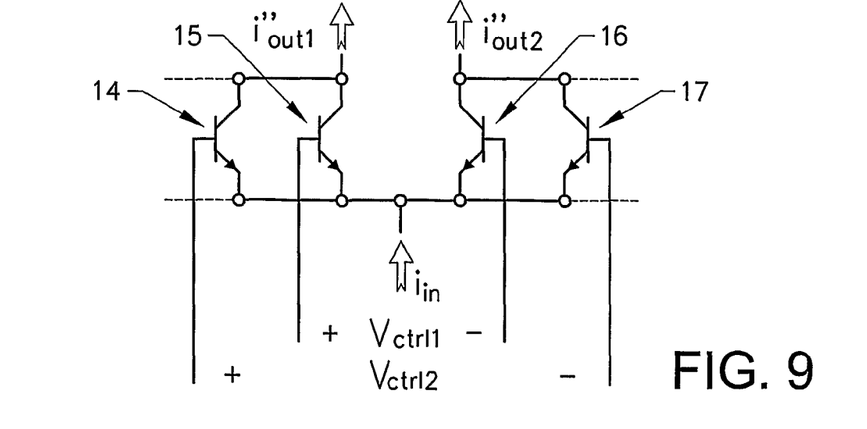
FIG. 9 shows the schematics for the present invention in its least complicated form.

This leads to the present invention in its least complicated form, as shown in FIG. 9. Here, there is a first transistor 14, a second transistor 15, a third transistor 16 and a fourth transistor 17. The bases of the second transistor 15 and the third transistor 16 are connected to a first control voltage source $V_{ctrl1}$. The bases of the first transistor 14 and the fourth transistor 17 are connected to a second control voltage source $V_{ctrl2}$. The emitters of all transistors are connected to an input current $i_{in}$. The collectors of the first transistor 14 and the second transistor 15 are connected, and output a first output current $i''_{out1}$, and the collectors of the third transistor 16 and the fourth transistor 17 are connected, and output a second output current $i''_{out2}$.

By switching the transistors on and off, different amplification in discrete steps is obtained while $i''_{out1} + i''_{out2} = i_{in}$. In this configuration, one of the first transistor 14 and the fourth transistor 17 is always switched off, and one of the second transistor 15 and the third transistor 16 is also always switched off.

Figure 8:
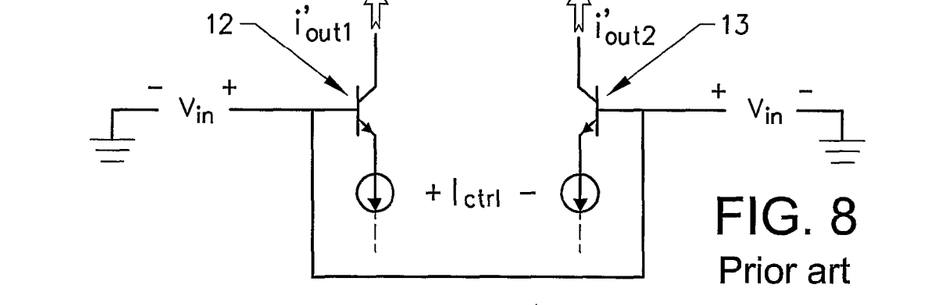
FIG. 8 shows the schematics for a prior art circuit used for explaining the present invention in general terms.

Thus, comparing the configuration with reference to FIG. 8, with the configuration according to FIG. 9, in the configuration according to FIG. 9 each transistor has been divided into two separate transistors where each one of these transistors may be turned on or off, thus controlling the at least two output currents digitally, changing the attenuation in discrete steps. The value of the output currents for different modes of amplification is depending on the relation between the transistor sizes.

As discussed below, it is possible to use the present invention such that the at least two output currents are semi-digitally controlled.

The present invention is not limited to the embodiments described and discussed above, but may vary freely within the scope of the appended claims.

For example, in the examples, NPN bipolar transistors are shown, but any suitable transistors may of course be used. The resistance values vary with the chosen transistor type, where the choice of transistor also sets the resistance value.

Instead of turning the transistor pairs on or off, it is possible to also control them by controlling the bias current as described in the background, such that the output currents are semi-digitally controlled. The difference from prior art is that since there are a number of attenuation steps, it is possible to change the relative attenuation between for example 0 and 10 dB without suffering the penalty of small bias voltages. In other words, the total dynamic range for attenuation is divided into a number of sub-ranges, resulting in that the voltage span, which previously was applied on the total dynamic range for attenuation, now is applied on relatively smaller attenuation range spans. This leads to that the accuracy when adjusting the bias voltage is relieved. Thus, for each discrete step, the output currents are controlled in an analogue manner.

For example, previously, a span of 50 mV was used to control an attenuation between 0 dB and −80 dB; now the same span of 50 mV is used to control an attenuation of 10 dB. It is thus easier to set an accurate attenuation, by means of the present invention.

Figure 10:
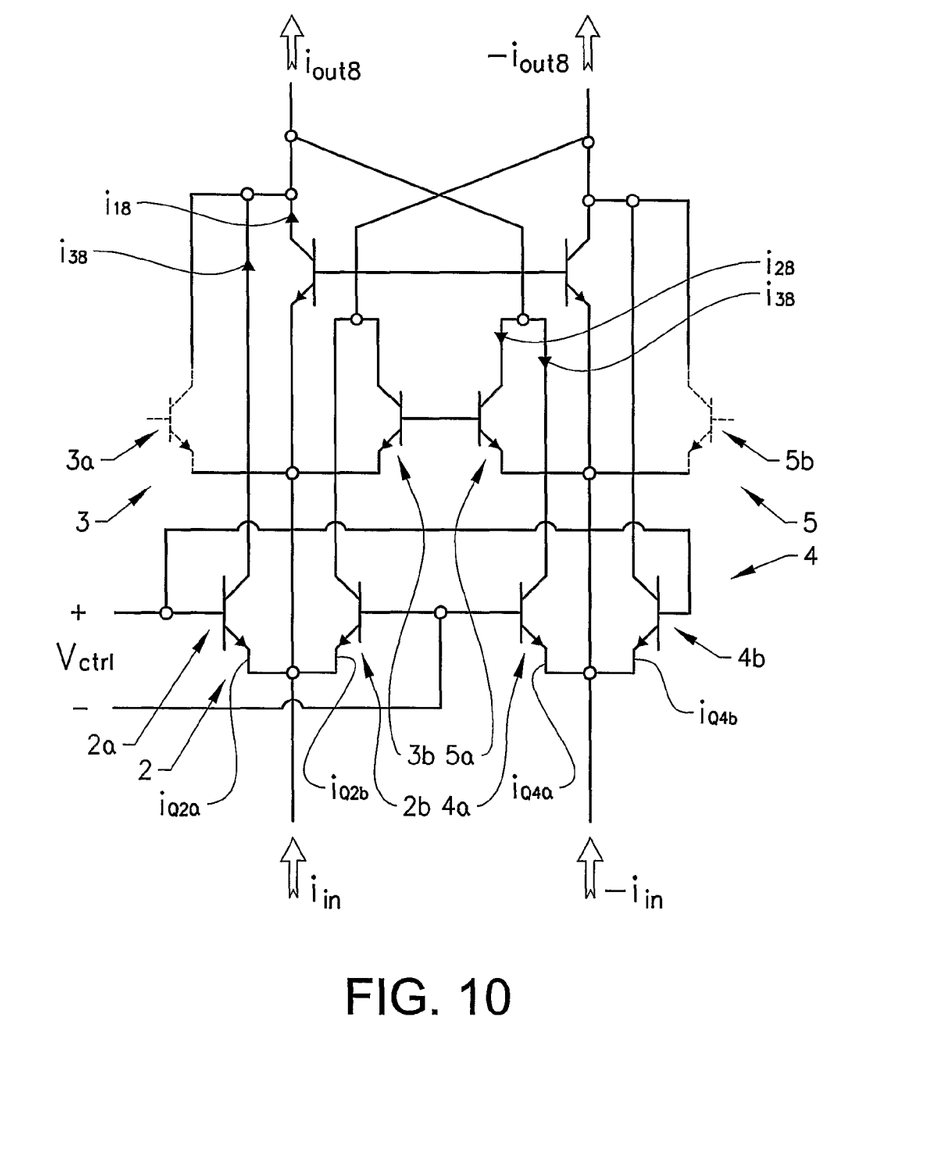
FIG. 10 shows the schematics for an alternative embodiment of the present invention where the output currents are semi-digitally controlled.

This embodiment alternative is also illustrated in an example with reference to FIG. 10, showing another mode of amplification. The same circuit components are used as in FIGS. 2-5, but there is also a control voltage $V_{ctrl}$ where its positive terminal is connected to the bases of the first transistor pair's first transistor 2a and the third transistor pair's second transistor 4b, and where its negative terminal is connected to the bases of the first transistor pair's second transistor 2b and the third transistor pair's first transistor 4a. By varying the control voltage $V_{ctrl}$, a corresponding DC bias current $i_{Q2a}$, $i_{Q2b}$, $i_{Q4a}$, $i_{Q4b}$, is provided for each one of the transistors 2a, 2b; 4a, 4b in the first pair 2 and the third pair 4.

Generally, the following expression is valid for the circuit according to FIG. 10:

$$i_{out8} = i_{18} - i_{28} - i_{38} = \frac{33}{60}i_{in} - \frac{20}{60}i_{in} + \frac{i_{Q2a} - i_{Q4a}}{i_{Q2a} + i_{Q4a}} \frac{7}{60}i_{in}.$$

By letting either $i_{Q2a}$ or $i_{Q4a}$ being equal to zero, it is apparent that the output current $i_{out8}$ varies according to the below:

$$\frac{i_{in}}{3} \geq i_{out8} \geq \frac{i_{in}}{10}.$$

This embodiment alternative is also illustrated in another example, now with reference to FIG. 9. Instead of the case described previously, where both $V_{ctrl1}$ and $V_{ctrl2}$ control the output currents $i'_{out1}$, $i'_{out2}$ in a digital manner, changing the attenuation in discrete steps, the output currents are controlled in an analogue manner for each discrete step.

In a first setting, $V_{ctrl1}$ controls the related second transistor 15 and third transistor 16 in an analogue manner and $V_{ctrl2}$ controls the related first transistor 14 and fourth transistor 17 in a digital manner by switching them on and off. A number of alternatives are possible for this setting:

The first transistor 14 is turned on and fourth transistor 17 is turned off by means of $V_{ctrl2}$. By changing $V_{ctrl1}$, the attenuation may be continuously transferred between the second transistor 15 and the third transistor 16.

The first transistor 14 is turned off and fourth transistor 17 is turned on by means of $V_{ctrl2}$. By changing $V_{ctrl1}$, the attenuation may be continuously transferred between the second transistor 15 and the third transistor 16.

The connections of the control voltage $V_{ctrl}$ may vary, for example its polarities may be reversed.

For all examples shown, instead of the voltage sources shown, corresponding current sources may be used, and vice versa. For either a voltage or a current, the term "signal" may be used. Thus the input currents shown in some examples may be constituted by input voltages instead, and generally they are constituted by input signals.

The terms amplification and attenuation are both used in the description; it is to be understood that these terms refer to the same function, an attenuation being a negative amplification.

The present invention is for example implemented in a so-called current-mode attenuator such as for example a Gilbert cell.

The transistor pairs discussed in the examples above may be comprised by any number of transistors constituting a group of transistors.

The invention claimed is:

1. A circuit, comprising:
a first part and a second part, the first part comprising at least one transistor pair with common emitters, said transistor pair each comprising a first transistor and a second transistor, the first part further comprising a further transistor, wherein all emitters in the first part are connected to a first input connection, wherein the collectors of each first transistor and the further transistor in the first part are connected to a first output connection, wherein the second part comprises at least one transistor pair with common emitters, said transistor pair each comprising a first transistor and a second transistor, the second part further comprising a further transistor, wherein all emitters in the second part are connected to a second input connection, wherein the collectors of each second transistor and the further transistor in the second part are connected to a second output connection, wherein furthermore the base of the first transistor in each transistor pair in the first part and the base of the second transistor in each transistor pair in the second part are connected, respectively, and the base of the second transistor in each transistor pair in the first part and the base of the first transistor in each transistor pair in the second part are connected, respectively, and wherein the bases of the further transistors are connected, wherein the transistor pairs are connected such that they are arranged to be fed with at least one input signal, and such that they are arranged to output at least two currents, and wherein at least two transistors are arranged to be biased in such a way that desired signal paths are obtained in the circuit, such that a desired output current ratio is obtained.

2. The circuit according to claim 1, wherein the circuit is arranged to present amplification in at least two discretely controlled steps.

3. The circuit according to claim 1, wherein the collectors of each second transistor in the first part are connected to the second output connection and the collectors of each first transistor in the second part are connected to the first output connection.

4. The circuit according to claim 1, wherein the collectors of each second transistor in the first part and the collectors of each first transistor in the second part are connected to a common output line.

5. The circuit according to claim 1, wherein the common output line is connected to a voltage potential.

6. The circuit according to claim 1, wherein for at least one transistor pair in the first part and one transistor pair in the second part, wherein the base of the first transistor in said transistor pair in the first part is connected to the base of the second transistor in said transistor pair in the second part, a control voltage has one polarity connected to the base of the first transistor in said transistor pair in the first part and the base of the second transistor in said transistor pair in the second part, and the other polarity connected to the base of the second transistor in said transistor pair in the first part and the base of the first transistor in said transistor pair in the second part.

* * * * *